(12) United States Patent
Wahl et al.

(10) Patent No.: US 8,906,802 B2
(45) Date of Patent: Dec. 9, 2014

(54) METHODS OF FORMING TRENCH/VIA FEATURES IN AN UNDERLYING STRUCTURE USING A PROCESS THAT INCLUDES A MASKING LAYER FORMED BY A DIRECTED SELF-ASSEMBLY PROCESS

(71) Applicant: GLOBALFOUNDRIES Inc., Grand Cayman (KY)

(72) Inventors: Jeremy A. Wahl, Delmar, NY (US); Gerard M. Schmid, Delmar, NY (US); Richard A. Farrell, Albany, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/839,284

(22) Filed: Mar. 15, 2013

(65) Prior Publication Data
US 2014/0273469 A1    Sep. 18, 2014

(51) Int. Cl.
*H01L 21/00* (2006.01)
*G03C 5/00* (2006.01)
*H01L 21/308* (2006.01)

(52) U.S. Cl.
CPC ................................. *H01L 21/3086* (2013.01)
USPC .............. 438/637; 438/640; 430/5; 430/326

(58) Field of Classification Search
None
See application file for complete search history.

(56) References Cited

U.S. PATENT DOCUMENTS

| | | | |
|---|---|---|---|
| 6,890,624 B1 | 5/2005 | Kambe et al. | |
| 7,118,900 B2 | 10/2006 | Seul et al. | |
| 7,161,168 B2 | 1/2007 | Heath et al. | |
| 7,521,094 B1 | 4/2009 | Cheng et al. | |
| 7,713,758 B2 | 5/2010 | Yamashita et al. | |
| 7,906,775 B2 | 3/2011 | Heath et al. | |
| 7,923,373 B2 | 4/2011 | Sandhu | |
| 8,059,350 B2 | 11/2011 | Albrecht et al. | |
| 8,119,017 B2 | 2/2012 | Albrecht et al. | |
| 8,133,341 B2 | 3/2012 | Nealey et al. | |
| 8,133,534 B2 | 3/2012 | Stoykovich et al. | |
| 8,168,284 B2 | 5/2012 | Nealey et al. | |
| 8,226,838 B2 | 7/2012 | Cheng et al. | |
| 8,257,598 B2 | 9/2012 | Albrecht et al. | |
| 8,263,002 B1 | 9/2012 | Chow et al. | |
| 8,287,957 B2 | 10/2012 | Nealey et al. | |
| 8,304,493 B2 | 11/2012 | Millward et al. | |
| 8,336,003 B2 | 12/2012 | Cheng et al. | |
| 2009/0035668 A1 | 2/2009 | Breyta et al. | |
| 2010/0294740 A1 | 11/2010 | Cheng et al. | |
| 2010/0316849 A1 | 12/2010 | Millward et al. | |
| 2011/0033786 A1 | 2/2011 | Sandhu | |

(Continued)

*Primary Examiner* — Zandra Smith
*Assistant Examiner* — Pamela E Perkins
(74) *Attorney, Agent, or Firm* — Amerson Law Firm, PLLC (57) ABSTRACT

One illustrative method disclosed herein includes the steps of performing a directed self-assembly process to form a DSA masking layer, performing at least one process operation to remove at least one of the features of the DSA masking layer so as to thereby define a patterned DSA masking layer with a DSA masking pattern, performing at least one process operation to form a patterned transfer masking layer having a transfer masking pattern comprised of a plurality of features that define a plurality of openings in the transfer masking layer, wherein the transfer masking pattern is the inverse of the DSA masking pattern, and performing at least one etching process through the patterned transfer masking layer on a layer of material to form a plurality of trench/via features in the layer of material.

12 Claims, 9 Drawing Sheets

(56) References Cited

U.S. PATENT DOCUMENTS

| | | |
|---|---|---|
| 2012/0189824 A1 | 7/2012 | Nealey et al. |
| 2012/0202017 A1 | 8/2012 | Nealey et al. |
| 2012/0331428 A1 | 12/2012 | Cheng et al. |
| 2013/0084704 A1* | 4/2013 | Watanabe et al. ............. 438/703 |
| 2013/0273330 A1* | 10/2013 | Wang et al. ................... 428/172 |

* cited by examiner

METHODS OF FORMING TRENCH/VIA FEATURES IN AN UNDERLYING STRUCTURE USING A PROCESS THAT INCLUDES A MASKING LAYER FORMED BY A DIRECTED SELF-ASSEMBLY PROCESS

BACKGROUND OF THE INVENTION

1. Field of the Invention

Generally, the present disclosure relates to the manufacture of semiconductor devices, and, more specifically, to various methods of forming trench/via features in an underlying structure using a process that includes a masking layer formed by a directed self-assembly process.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To improve the operating speed of field effect transistors (FETs), and to increase the density of FETs on an integrated circuit device, device designers have greatly reduced the physical size of FETs over the past decades. More specifically, the channel length of FETs has been significantly decreased, which has resulted in improving the switching speed of FETs and the overall functionality of the circuit. Further scaling (reduction in size) of the channel length of transistors is anticipated in the future. While this ongoing and continuing decrease in the channel length of transistor devices has improved the operating speed of the transistors and integrated circuits that are formed using such transistors, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices.

Typically, due to the large number of circuit elements and the required complex layout of modern integrated circuits, the electrical connections of the individual circuit elements cannot be established within the same level on which the circuit elements, such as transistors, are manufactured. Rather, modern integrated circuit products have multiple so-called metallization layer levels that, collectively, contain the "wiring" pattern for the product, i.e., the conductive structures that provide electrical connection to the transistors and the circuits, such as conductive vias and conductive metal lines. In general, the conductive metal lines are used to provide intra-level (same level) electrical connections, while inter-level (between levels) connections or vertical connections are referred to as vias. In short, the vertically oriented conductive via structures provide the electrical connection between the various stacked metallization layers. Accordingly, the electrical resistance of such conductive structures, e.g., lines and vias, becomes a significant issue in the overall design of an integrated circuit product, since the cross-sectional area of these elements is correspondingly decreased, which may have a significant influence on the effective electrical resistance and overall performance of the final product or circuit.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used aluminum for the conductive lines and vias. The use of low-k dielectric materials tends to improve the signal-to-noise ratio (S/N ratio) by reducing crosstalk as compared to other dielectric materials with higher dielectric constants. However, the use of such low-k dielectric materials can be problematic as they tend to be less resistant to metal migration as compared to some other dielectric materials.

Copper is a material that is difficult to directly etch using traditional masking and etching techniques. Thus, conductive copper structures, e.g., conductive lines or vias, in modern integrated circuit devices are typically formed using known single or dual damascene techniques. In general, the damascene technique involves (1) forming a trench/via in a layer of insulating material, (2) depositing one or more relatively thin barrier or liner layers (e.g., TiN, Ta, TaN), (3) forming copper material across the substrate and in the trench/via, and (4) performing a chemical mechanical polishing process to remove the excess portions of the copper material and the barrier layer(s) positioned outside of the trench/via to define the final conductive copper structure. The copper material is typically formed by performing an electrochemical copper deposition process after a thin conductive copper seed layer is deposited by physical vapor deposition on the barrier layer.

Photolithography is one of the basic processes used in manufacturing integrated circuit products. At a very high level, photolithography involves: (1) forming a layer of light or radiation-sensitive material, such as a photoresist material, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the final circuit layout (design) on the integrated circuit product. Historically, the pitches employed in integrated circuit products were large enough such that a desired pattern could be formed using a single patterned photoresist masking layer. However, in recent years, device dimensions and pitches have been reduced in size to the point where existing photolithography tools, e.g., 193 nm wavelength photolithography tools, cannot form a single patterned mask layer with all of the features of the overall target pattern. That is, existing 193 mm wavelength photolithography tools and techniques are limited to printing patterns having a pattern pitch above 70 nm using a single layer of photoresist. Accordingly, device designers have resorted to techniques that involve performing multiple exposures to define a single target pattern in a layer of material. One such technique is generally referred to as double patterning or double patterning technology (DPT). In general, double patterning is an exposure method that involves splitting (i.e., dividing or separating) a dense overall target circuit pattern into two separate, less-dense patterns. The simplified, less-dense patterns are then printed separately utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively enables the printing of even smaller features than would otherwise be possible using a single mask using existing photolithography tools. There are several double patterning techniques employed by semiconductor manufacturers.

While such double patterning techniques can enable the printing of features with pitches less than can be formed using a single layer of patterned photoresist material, such double patterning processes are time-consuming and require a great deal of precision in terms of overlay accuracy. So-called sidewall image transfer techniques can also be employed to form patterns having reduced pitches, but such sidewall image transfer techniques are time-consuming and expensive.

Recently device designers have investigated using so-called directed self-assembly (DSA) processing techniques to manufacture masking layers for use in semiconductor manufacturing. In general, a DSA process involves the use of self-assembling block copolymers that arrange themselves in a patterned arrangement of features, e.g., spaced-apart line-type features, spaced-apart cylinder-type features, etc. The manner in which layers of such materials are formed using DSA processes are well known to those skilled in the art. In forming a layer of line-type features, DSA processing may be controlled such that the width and pitch of such line-type features may be controlled by controlling the composition of the DSA materials. More importantly, using DSA formation techniques, the line width and pitch of the features in the resulting DSA material may be formed to substantially smaller dimensions than they could otherwise be formed using traditional photolithography tools and equipment. However, the use of DSA processing techniques to form a patterned mask layer only results in the formation of features, e.g., lines or cylinders, that project above the surface where the DSA materials are formed. Thus, masking layers formed using DSA processing techniques cannot be used to form trenches or openings in an underlying layer of material.

The present disclosure is directed to various methods of forming trench/via features in various structures that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming trench/via features in an underlying structure using a process that includes a masking layer formed by a directed self-assembly process. One illustrative method disclosed herein includes the steps of performing a directed self-assembly process to form a DSA masking layer, performing at least one process operation to remove at least one of the features of the DSA masking layer so as to thereby define a patterned DSA masking layer with a DSA masking pattern, performing at least one process operation to form a patterned transfer masking layer having a transfer masking pattern comprised of a plurality of features that define a plurality of openings in the transfer masking layer, wherein the transfer masking pattern is the inverse of the DSA masking pattern, and performing at least one etching process through the patterned transfer masking layer on a layer of material to form a plurality of trench/via features in the layer of material.

Another illustrative method disclosed herein includes forming a hard mask layer above a layer of material, performing a directed self-assembly process to form a DSA masking layer above the hard mask layer, performing at least one process operation to remove at least one of the features of the DSA masking layer so as to thereby define a patterned DSA masking layer with a DSA masking pattern, performing at least one process operation to form a patterned transfer masking layer on the hard mask layer, wherein the patterned transfer masking layer has a transfer masking pattern that is the inverse of the DSA masking pattern, and performing at least one etching process through the patterned transfer masking layer on at least the hard mask layer of material to form a plurality of trench/via features in the hard mask layer.

Yet another illustrative method disclosed herein includes the steps of forming a hard mask layer on a layer of material, forming a sacrificial layer of material on the hard mask layer, performing a directed self-assembly process to form a DSA masking layer above the sacrificial layer of material, performing at least one first etching process operation to remove at least one of the features of the DSA masking layer so as to thereby define a patterned DSA masking layer with a DSA masking pattern, performing at least one first etching process on the sacrificial layer through the patterned DSA masking layer to remove portions of the sacrificial layer of material and define a patterned layer of sacrificial material, and forming a transfer layer of material above the patterned layer of sacrificial material. In this example, the method includes the additional steps of performing at least one process operation to planarize an upper surface of the transfer layer of material with an upper surface of the patterned layer of sacrificial material, performing at least one second etching process to remove the patterned sacrificial layer of material selectively relative to the transfer layer of material and to thereby define a patterned transfer masking layer having a transfer masking pattern that is the inverse of the DSA masking pattern, and performing at least one third etching process through the patterned transfer masking layer on at least the hard mask layer of material to form a plurality of trench/via features in the hard mask layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming trench/via features in an underlying structure using a process that includes a masking layer formed by a directed self-assembly process. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail.

The novel methods disclosed herein will be disclosed in the context of trench and or via type features in an underlying structure or one or more layers of underlying material. The trench/via type features referenced herein are intended to be representative of any type of opening formed in any type of material or structure. The trench/via features discussed herein may be of any desired shape, depth or configuration. For example, in some embodiments, the trench/via feature may be a classic trench that does not extend to an underlying layer of material, wherein a conductive line, for example, may be formed in such a trench. In other embodiments, the trench/via features discussed herein may be a through-hole type feature, e.g., a classic via, that extends all of the way through a structure of a layer of material and exposes an underlying layer of material or an underlying structure, such as an underlying metal line. Thus, the shape, size, depth or configuration of the trench/via features discussed herein should not be considered to be a limitation of the present inventions. The trench/via features may be formed by performing any of a variety of different etching processes, e.g., a dry reactive ion etching process, a wet etching process, etc. Additionally, the attached drawings include various cross-sectional views and plan views of an illustrative integrated circuit product or device 10. In general, drawings that contain the "B" designation, e.g., FIG. 1B, are plan views of the device 10. The cross-sectional views in the attached drawings are taken where indicated.

Figure 1A:
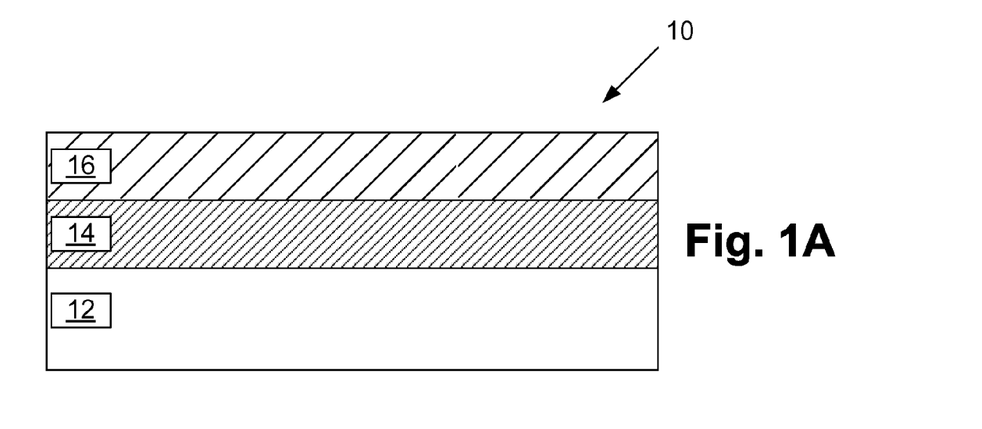
FIGS. 1A-1B, are a cross-sectional view and a plan view, respectively, of an illustrative integrated circuit product 10 disclosed herein that is comprised of a structure or a first layer of material 12, a hard mask layer 14 and a sacrificial layer of material 16.
Figure 1B:
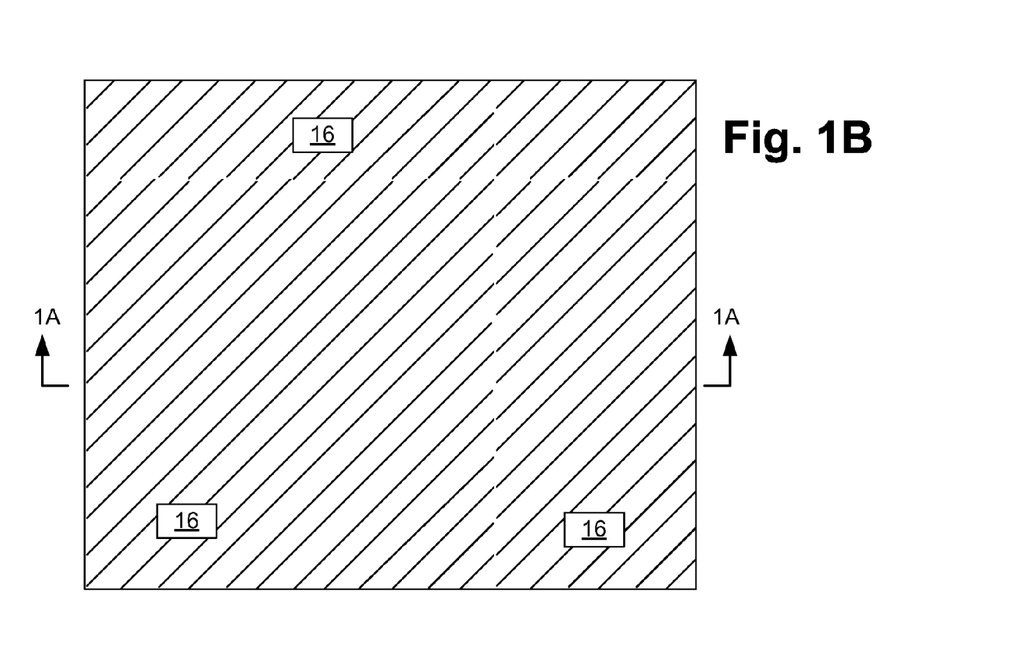

FIGS. 1A-1B depict the integrated circuit device 10 at an early stage of manufacturing. The device 10 may be formed above a semiconductor substrate (not shown). The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 10 may be any type of integrated circuit device.

With continuing reference to FIGS. 1A-1B, in this depicted example, the integrated circuit product 10 is comprised of a structure or a first layer of material 12, a hard mask layer 14 and a sacrificial layer of material 16. The layers 12, 14 and 16 may be formed by performing a variety of known processing techniques, such as a chemical vapor deposition (CVD) process, an atomic layer deposition (ALD) process, a physical vapor deposition (PVD) process, or plasma enhanced versions of such processes, and the thickness of such layers may vary depending upon the particular application.

In one embodiment, the first layer of material 12 may be a layer of insulating material that is formed above a semiconductor substrate that will eventually have one or more conductive structures, e.g., a conductive line or via, formed therein, as described more fully below. The first layer of material 12 and any associated conductive structures formed in the first layer of insulating material 12 may all be considered to be part of a metallization layer that may be located at any level of the integrated circuit product 10.

The layers 12, 14 and 16 may be comprised of a variety of different materials. In general, the hard mask layer 14 should be comprised of a material that exhibits good etch selectivity relative to the first and second layers of material 12, 16. The sacrificial layer of material 16 should be made of a material that exhibits good etch selectivity relative to the hard mask layer 14 and a patterned masking layer that will be formed above the sacrificial layer of material 16, as described more fully below. In one example, the first layer of material 12 may be comprised of any insulating material, e.g., silicon dioxide, layers of so-called low-k (k value less than about 3.3) insulating material, the hard mask layer 14 may be comprised of, for example, silicon nitride, and the sacrificial layer of material 16 may be comprised of silicon dioxide. Of course, the materials for the layers 14, 16 could be reversed. In the depicted example, the hard mask layer 14 is depicted as being a single layer of material. In practice, the hard mask layer 14 may be comprised of two or more layers of material depending upon the particular application.

Figure 2A:
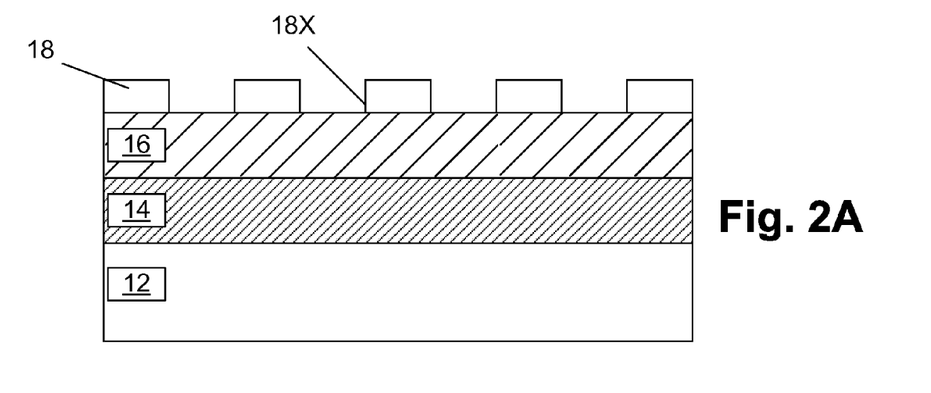
FIGS. 2A-2B are a cross-sectional view and a plan view, respectively, of the device 10 after a DSA masking layer 18 is formed above the sacrificial layer of material 16 by performing a so-called directed self-assembly (DSA) process.
Figure 2B:
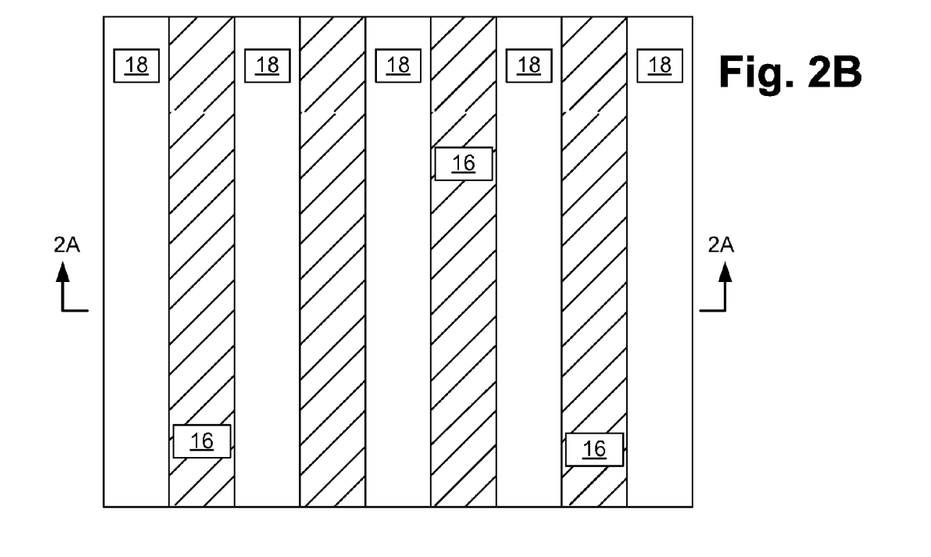

FIGS. 2A-2B depict the device 10 after a DSA masking layer 18 is formed above the sacrificial layer of material 16 by performing a so-called directed self-assembly (DSA) process. In general, the DSA process involves the use of self-assembling block copolymers that arrange themselves in a patterned arrangement of features, e.g., spaced-apart line-type features, spaced-apart cylinder-type features, etc. The manner in which layers of such materials are formed are well known to those skilled in the art. In forming a layer of line-type features, such as the features depicted in DSA masking layer 18 depicted herein, the DSA process may be controlled such that the width and pitch of such line-type features may be controlled by controlling the composition of the DSA materials. More importantly, using DSA formation techniques, the line width and pitch of the features in the DSA masking layer 18 may be formed to substantially smaller dimensions than they could otherwise be formed using traditional photolithography tools and equipment. For example, the pitch of the illustrative line-type features depicted in the DSA masking layer 18 may fall within the range of about 10-50 nm using current-day technologies. Note that, in the depicted example, the DSA masking layer 18 defines a plurality of openings 18X. In one illustrative example, the DSA masking layer 18 may be formed by spin-coating a structure, such as a wafer or substrate, with the DSA material and then performing an annealing process at a temperature of, for example, about 200-300° C. Importantly, as noted above, the present inventions should not be considered as being limited to the formation of a DSA masking layer 18 comprised of line-type features, as the method disclosed herein may also involve formation of a DSA masking layer 18 comprised of cylindrical shaped features that are formed by performing a DSA process.

Figure 3A:
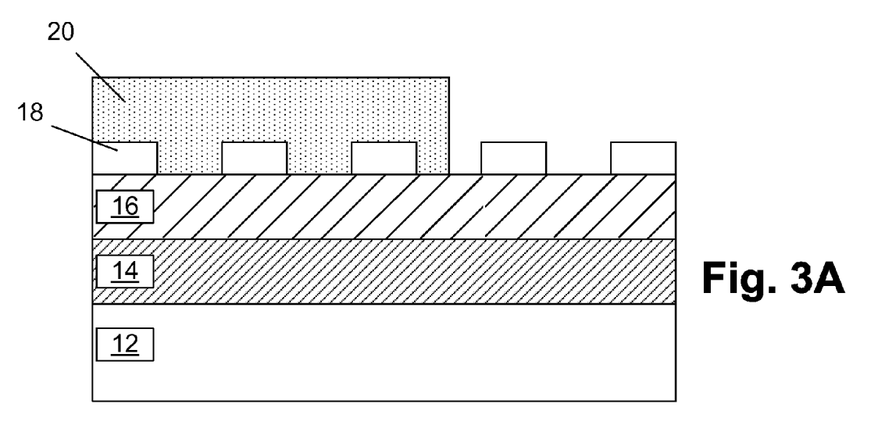
FIGS. 3A-3B are a cross-sectional view and a plan view, respectively, of the device after a patterned etch mask 20 has been formed above the DSA masking layer 18.
Figure 3B:
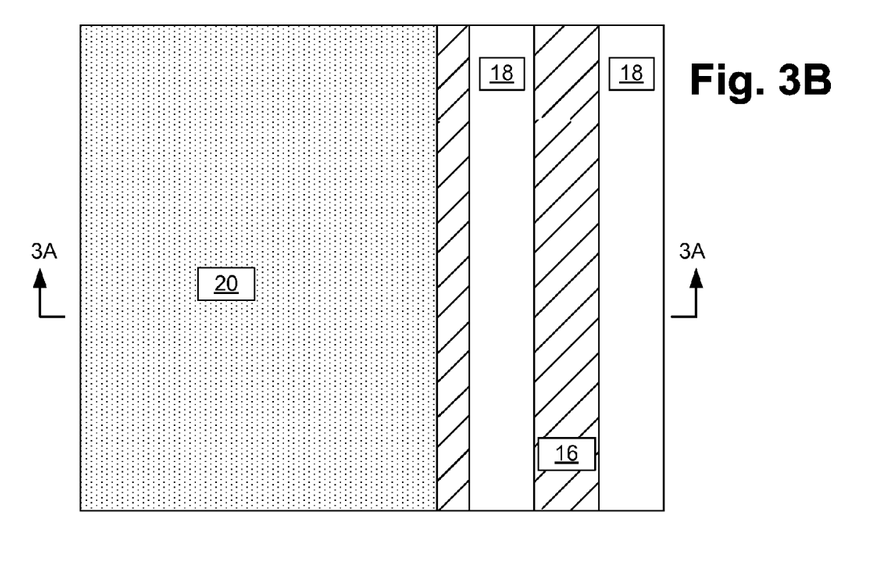

FIGS. 3A-3B depict the device after a patterned etch mask 20 has been formed above the DSA masking layer 18. The purpose of the patterned etch mask 20 is to cover some of the line-type features in the DSA masking layer 18 while leaving other of the line-type features in the DSA masking layer 18 exposed, so that they may be removed by performing additional process operations. In one embodiment, the patterned etch mask 20 may be a patterned layer of photoresist material that is formed using well-known photolithography tools and techniques. In this depiction, the patterned photoresist mask is shown as a single layer 20, but it is understood that layer 20 might include two or more layers that include, for example, anti-reflection coatings, planarizing coatings, etch layers, etc.

Figure 4A:
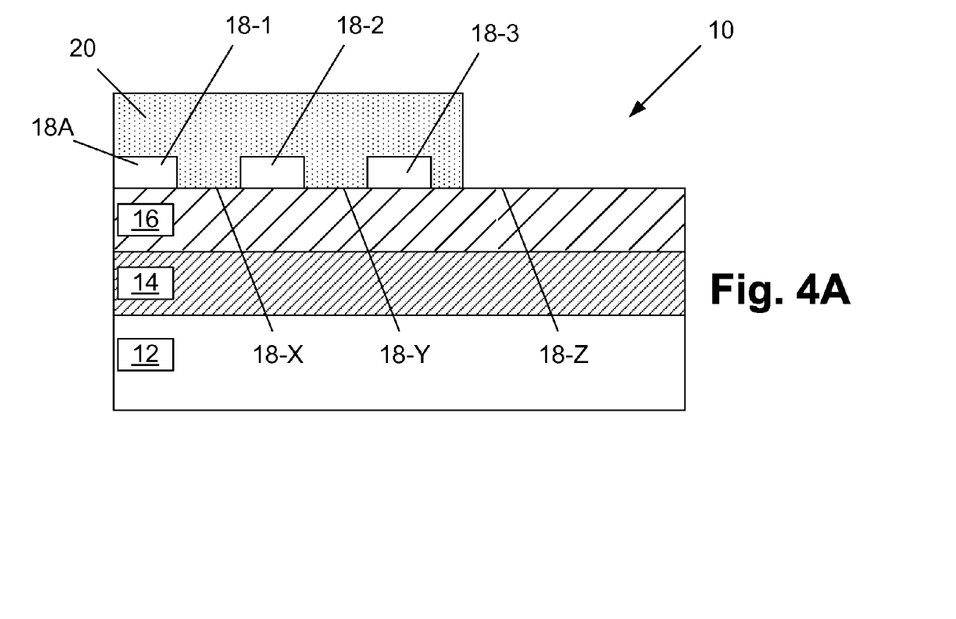
FIGS. 4A-4B are a cross-sectional view and a plan view, respectively, of the device 10 after an etching process has been performed through the patterned etch mask 20 to remove the exposed features of the DSA masking layer 18.
Figure 4B:
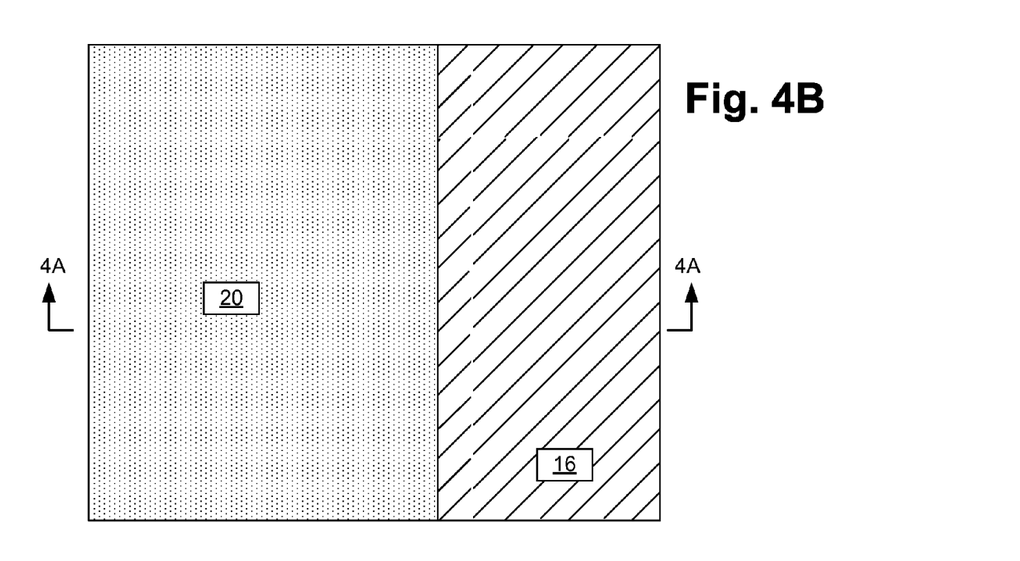

FIGS. 4A-4B depict the device 10 after an etching process has been performed through the patterned etch mask 20 to remove the exposed features of the DSA masking layer 18. This results in the formation of a patterned DSA masking layer 18A.

Figure 5A:
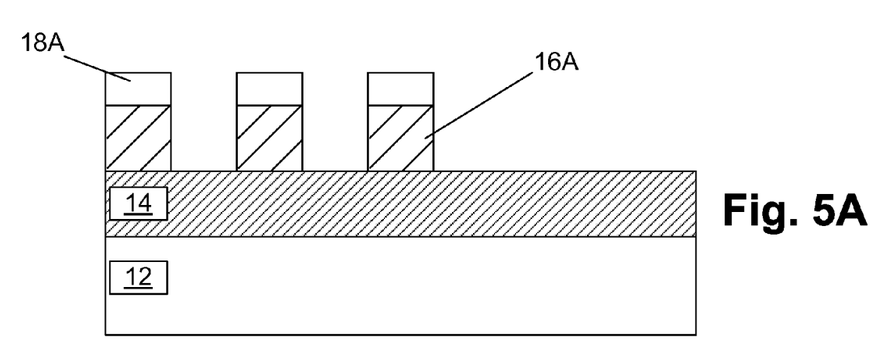
FIGS. 5A-5B are a cross-sectional view and a plan view, respectively, of the product 10 after the patterned etch mask 20 was removed and after an etching process was performed through the remaining portions of the patterned DSA masking layer 18A.
Figure 5B:
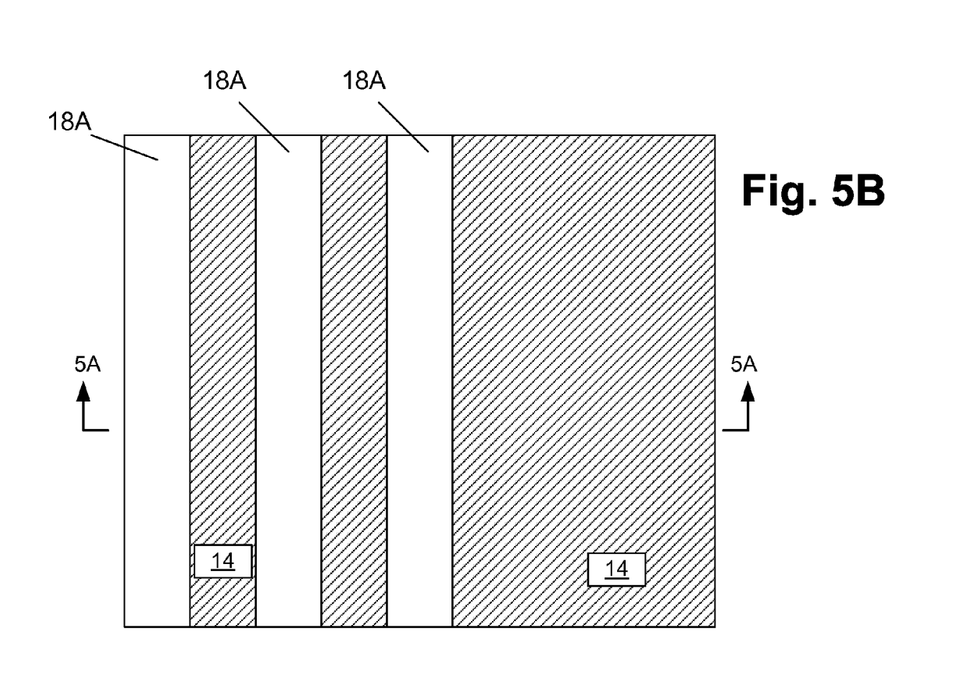

FIGS. 5A-5B depict the product 10 after several process operations were performed. First, the patterned etch mask 20 was removed. In one illustrative embodiment, the patterned etch mask 20 may be removed by performing an oxygen-based plasma process. Thereafter, an etching process was performed through the remaining portions of the patterned DSA masking layer 18A. This results in the patterned sacrificial layer of material 16A shown in FIG. 5A.

Figure 6A:
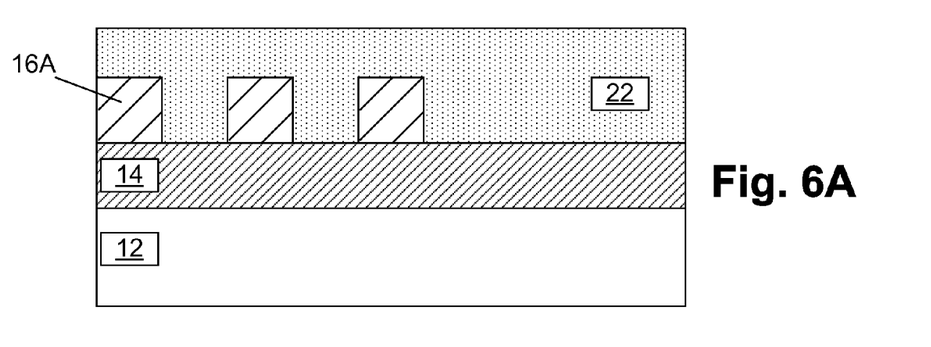
FIGS. 6A-6B are a cross-sectional view and a plan view, respectively, of the product 10 after patterned DSA masking layer 18A was removed, a pattern transfer layer of material 22 was formed above the device 10.
Figure 6B:
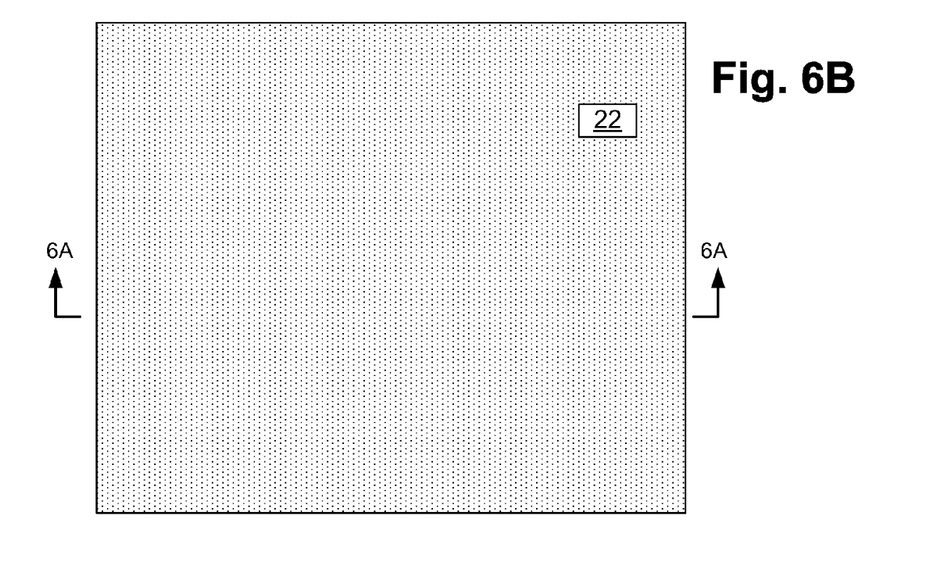

FIGS. 6A-6B depict the product 10 after several process operations were performed. First, the patterned DSA masking layer 18A was removed. Thereafter, a pattern transfer layer of material 22 was formed above the device 10. In general, the transfer layer of material 22 should be comprised of a material that exhibits good etch selectivity relative to the layers 12, 14 and 16. In one example, the transfer layer of material 22 may be comprised of amorphous carbon.

Figure 7A:
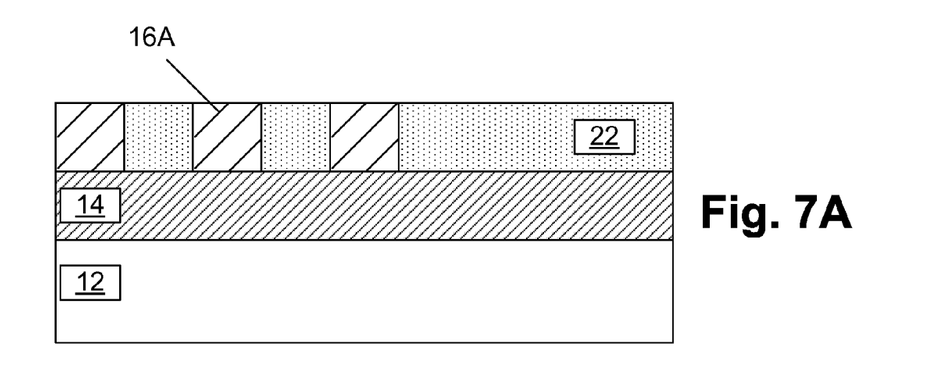
FIGS. 7A-7B are a cross-sectional view and a plan view, respectively, of the device after a planarization process was performed on the transfer layer of material 22 to planarize its upper surface with the patterned sacrificial layer 16A.
Figure 7B:
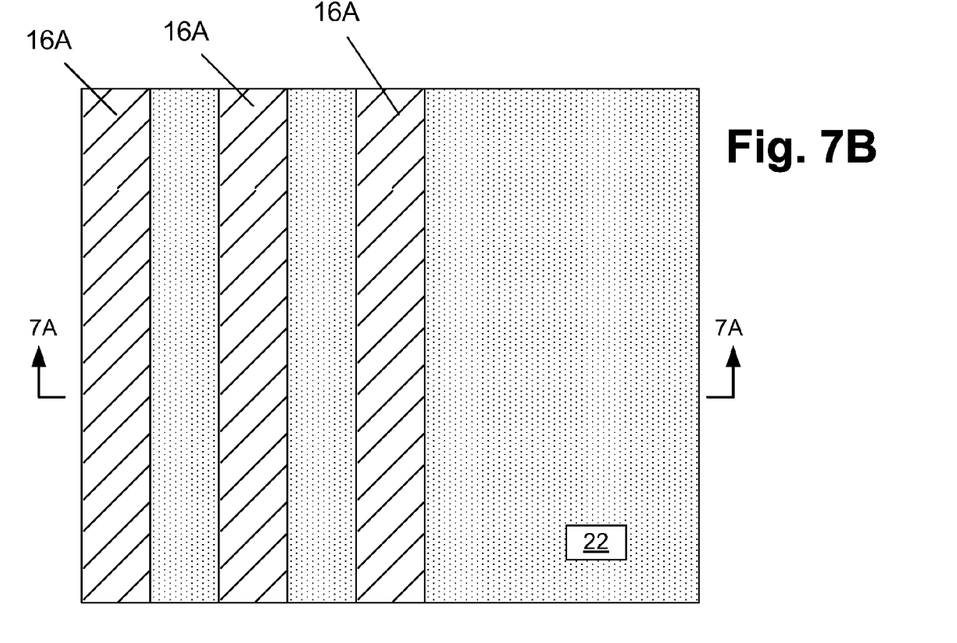

FIGS. 7A-7B depict the device after a planarization process, e.g., a CMP process or an etch-back process, was performed on the transfer layer of material 22 to planarize its upper surface with the patterned sacrificial layer 16A. This process operation exposes the remaining patterned sacrificial layer 16A for further processing.

Figure 8A:
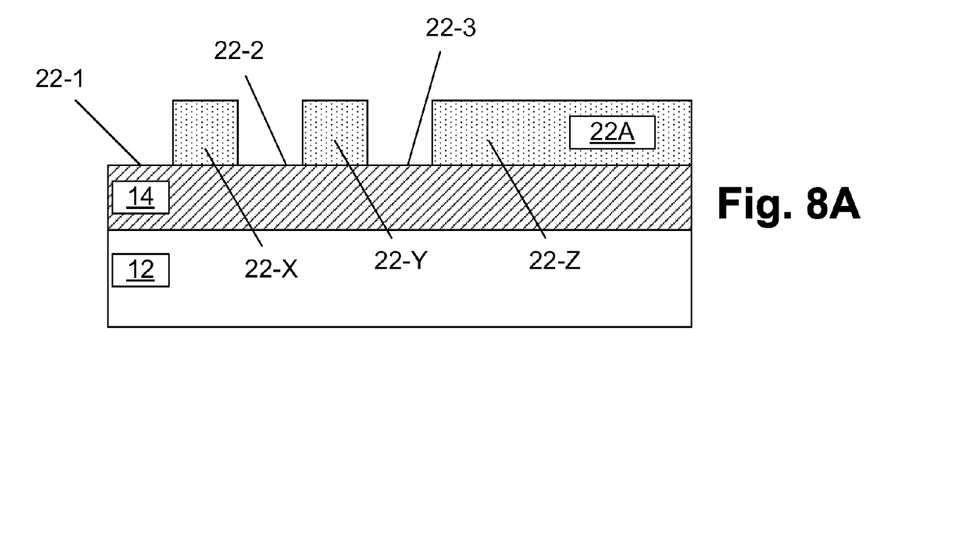
FIGS. 8A-8B are a cross-sectional view and a plan view, respectively, of the device 10 after an etching process was performed to remove the remaining portions of the patterned sacrificial layer 16A selectively relative to the transfer layer of material 22.
Figure 8B:
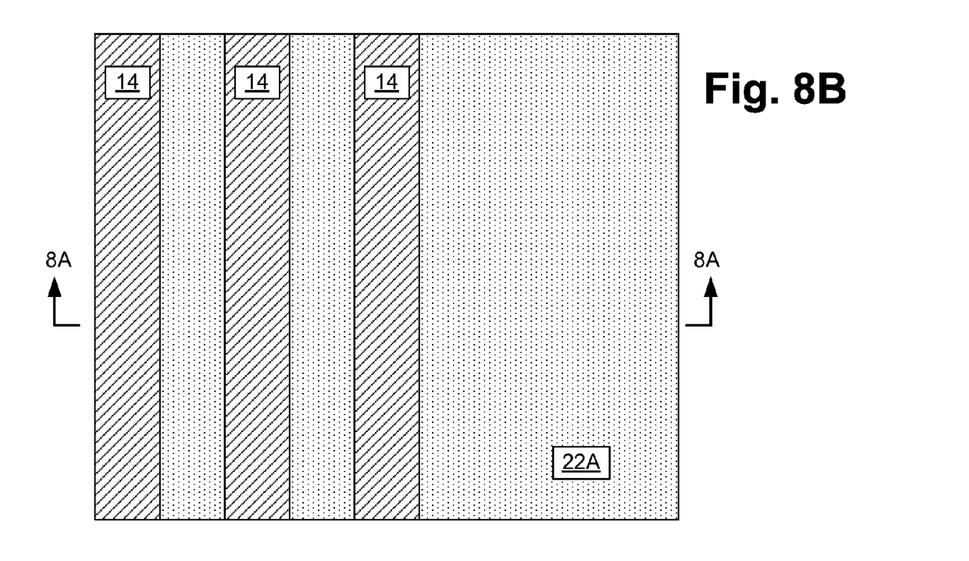

FIGS. 8A-8B depict the device 10 after an etching process was performed to remove the remaining portions of the patterned sacrificial layer 16A selectively relative to the transfer layer of material 22. This process operation exposes portions of the hard mask layer 14 for further processing and results in the definition of a transfer masking layer 22A. Note that, at this point in fabrication, the patterned transfer masking layer 22A has a transfer pattern that is the inverse of the pattern in the patterned DSA masking layer 18A shown in FIGS. 4A-4B. That is, the line type features 18-1, 18-2 and 18-3 (see FIG. 4A) correspond to openings 22-1, 22-2, and 22-3, respectively, in the patterned transfer making layer 22A (see FIG. 8A). Additionally, the openings 18-X, 18-Y and 18-Z in the DSA patterned masking layer 18A correspond to features 22-X, 22-Y, and 22-Z, respectively, in the patterned transfer making layer 22A. Thus, the patterned transfer masking layer 22A shown in FIGS. 8A-8B may be considered to be a patterned transfer masking layer wherein the opening/hole type features in the patterned DSA masking layer 18A are transferred to the patterned transfer masking layer 22A. In some embodiments, the patterned transfer masking layer 22A may be used to form trench/via type features in one or more underlying layers of material or structures.

Figure 9A:
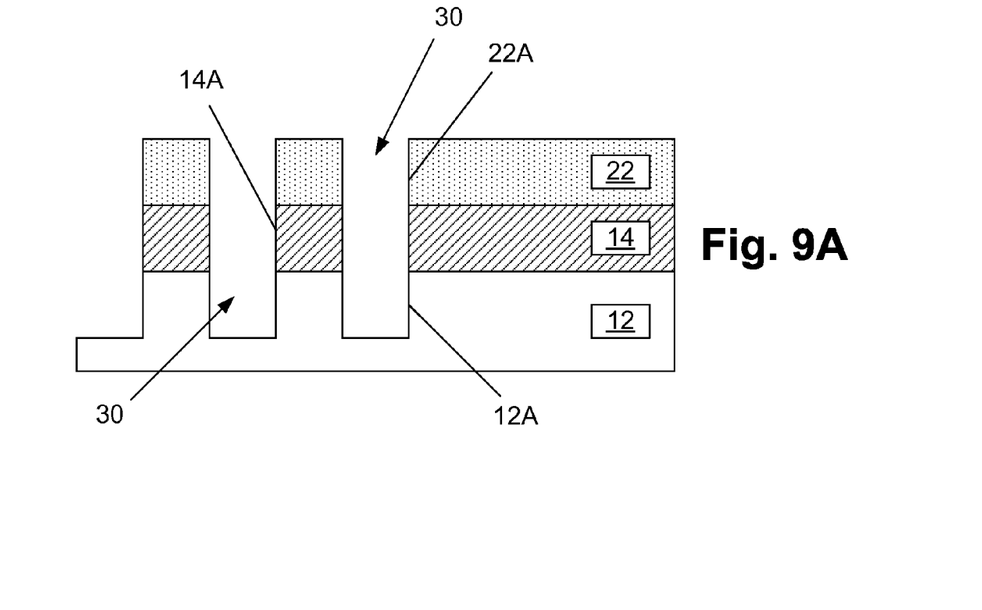
FIGS. 9A-9B are a cross-sectional view and a plan view, respectively, of the product after one or more etching processes were performed through the patterned transfer masking layer 22A on the hard mask layer 14 and the first layer of material 12.
Figure 9B:
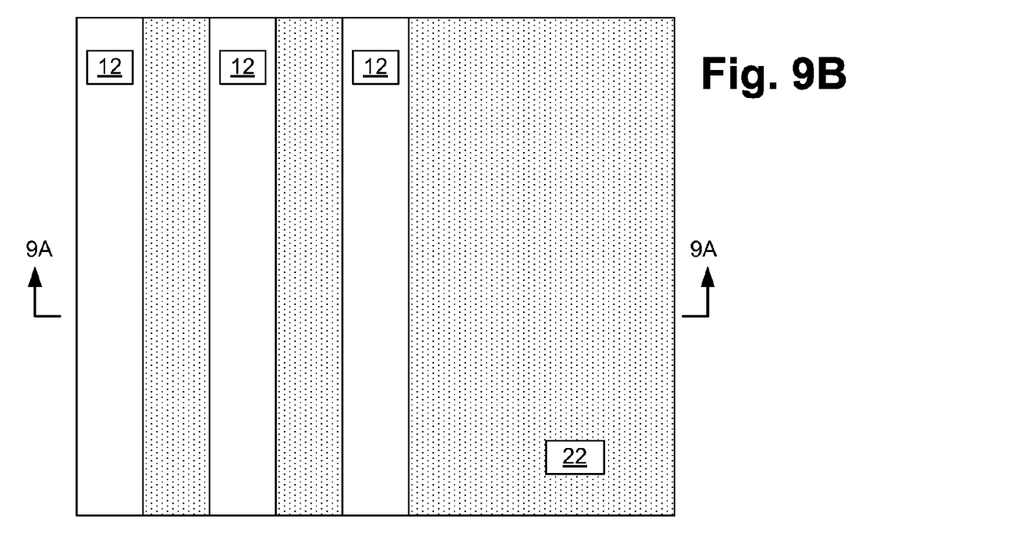

FIGS. 9A-9B depict the product after one or more etching processes were performed through the patterned transfer masking layer 22A on the hard mask layer 14 and the first layer of material 12. As depicted, this series of etching processes results in the formation of trench/via features 30 in the hard mask layer 14 and the first layer of insulating material 12. More specifically, a through-hole feature 14A has been formed in the now-patterned hard mask layer 14, while a trench 12A was formed in the first layer of material 12. In some applications, the patterned transfer masking layer 22A may only be used in forming the openings 14A in the hard mask layer 14. Thereafter, the patterned transfer masking layer 22A may be removed and the now-patterned hard mask layer 14 may be used as an etch mask to form the trench/via feature 12A in the first layer of material 12.

At this point in the process, flow, the trench/via features formed using the techniques described herein may be filled with one or more materials. For example, in one application, the patterned transfer masking layer 22A was used only in forming the openings 14A in the hard mask layer 14. Thereafter the patterned transfer masking layer 22A was removed and the now-patterned hard mask 14 was used as an etch mask to etch the trench/via feature 12A in the first layer of material 12. Next, a conductive structure, e.g., a conductive line (not shown), was formed in the opening 12A using traditional manufacturing techniques.

As should be clear from the foregoing, the novel methods disclosed herein provide an efficient and effective means of forming trench/via features in integrated circuit products that may solve or at least reduce some of the problems identified in the background section of this application. Note that the use of terms such as "first," "second," "third" or "fourth" to describe various etching processes and/or masking layers in this specification and in the attached claims is only used as a shorthand reference to such etching steps and does not necessarily imply that such etching steps are performed in that ordered sequence. Of course, depending upon the exact claim language, an ordered sequence of such etching processes may or may not be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
performing a directed self-assembly process to form a DSA masking layer, said DSA masking layer being comprised of a first plurality of openings and a first plurality of features that define said first plurality of openings in said DSA masking layer;
performing at least one process operation to remove at least one of said first plurality of features so as to thereby define a patterned DSA masking layer with a DSA masking pattern comprised of at least some of said first plurality of openings;
performing at least one process operation to form a patterned transfer masking layer having a transfer masking pattern comprised of a second plurality of openings and a second plurality of features that define said second plurality of openings in said transfer masking layer, wherein said transfer masking pattern is the inverse of said DSA masking pattern; and
performing at least one etching process through said patterned transfer masking layer on a layer of material to form a plurality of trench/via features in said layer of material.

2. The method of claim 1, wherein said layer of material is a layer of insulating material.

3. The method of claim 1, wherein said first plurality of features is comprised of a plurality of line-type features.

4. The method of claim 1, wherein said first plurality of features is comprised of a plurality of cylindrical-type features.

5. A method, comprising:
forming a hard mask layer above a layer of material;
performing a directed self-assembly process to form a DSA masking layer above said hard mask layer, said DSA masking layer having a first plurality of openings and a first plurality of features that define said first plurality of openings in said DSA masking layer;
performing at least one process operation to remove at least one of said first plurality of features so as to thereby define a patterned DSA masking layer with a DSA masking pattern comprised of at least some of said first plurality of openings;
performing at least one process operation to form a patterned transfer masking layer on said hard mask layer, said patterned transfer masking layer having a transfer masking pattern comprised of a second plurality of openings and a second plurality of features that define said second plurality of openings in said transfer masking layer, wherein said transfer masking pattern is the inverse of said DSA masking pattern; and
performing at least one etching process through said patterned transfer masking layer on at least said hard mask layer of material to form a plurality of trench/via features in said hard mask layer.

6. The method of claim 5, wherein said layer of material is a layer of insulating material.

7. The method of claim 5, wherein said first plurality of features is comprised of a plurality of line-type features.

8. The method of claim 5, wherein said first plurality of features is comprised of a plurality of cylindrical-type features.

9. A method, comprising:
forming a hard mask layer on a layer of material;
forming a sacrificial layer of material on said hard mask layer;
performing a directed self-assembly process to form a DSA masking layer above said sacrificial layer of material, said DSA masking layer being comprised of a first plurality of openings and a first plurality of features that define said first plurality of openings in said DSA masking layer;
performing at least one first etching process operation to remove at least one of said first plurality of features of said DSA masking layer so as to thereby define a patterned DSA masking layer with a DSA masking pattern comprised of first plurality of said first plurality of openings;
performing at least one first etching process on said sacrificial layer through said patterned DSA masking layer to remove portions of said sacrificial layer of material and define a patterned layer of sacrificial material;
forming a transfer layer of material above said patterned layer of sacrificial material;

performing at least one process operation to planarize an upper surface of said transfer layer of material with an upper surface of said patterned layer of sacrificial material;

performing at least one second etching process to remove said patterned sacrificial layer of material selectively relative to said transfer layer of material and to thereby define a patterned transfer masking layer having a transfer masking pattern comprised of a second plurality of openings and a second plurality of features that define said second plurality of openings in said transfer masking layer, wherein said transfer masking pattern is the inverse of said DSA masking pattern; and performing at least one third etching process through said patterned transfer masking layer on at least said hard mask layer of material to form a plurality of trench/via features in said hard mask layer.

10. The method of claim 9, wherein said layer of material is a layer of insulating material.

11. The method of claim 9, wherein said first plurality of features is comprised of a plurality of line-type features.

12. The method of claim 9, wherein said first plurality of features is comprised of a plurality of cylindrical-type features.

* * * * *